(12) United States Patent
Liao et al.

(10) Patent No.: US 12,094,823 B2
(45) Date of Patent: Sep. 17, 2024

(54) INTERCONNECTION STRUCTURE AND METHODS OF FORMING THE SAME

(71) Applicant: TAIWAN SEMICONDUCTOR MANUFACTURING COMPANY, LTD., Hsinchu (TW)

(72) Inventors: Wei-Hao Liao, Taichung (TW); Hsi-Wen Tien, Hsinchu (TW); Yu-Teng Dai, New Taipei (TW); Chih Wei Lu, Hsinchu (TW); Hsin-Chieh Yao, Hsinchu (TW); Chung-Ju Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 430 days.

(21) Appl. No.: 17/314,294

(22) Filed: May 7, 2021

(65) Prior Publication Data

US 2022/0367361 A1  Nov. 17, 2022

(51) Int. Cl.
*H01L 23/532* (2006.01)
*H01L 21/768* (2006.01)
*H01L 29/417* (2006.01)
*H01L 29/78* (2006.01)

(52) U.S. Cl.
CPC ...... *H01L 23/5329* (2013.01); *H01L 21/7682* (2013.01); *H01L 21/76885* (2013.01); *H01L 29/41791* (2013.01); *H01L 29/7851* (2013.01)

(58) Field of Classification Search
CPC ........... H01L 21/7682; H01L 21/76885; H01L 29/41791; H01L 29/7851; H01L 29/66795; H01L 21/76837; H01L 2221/1047; H01L 23/5222; H01L 23/481; H01L 21/76826; H01L 21/76801; H01L 21/76814; H01L 21/76822; H01L 21/76828; H01L 21/76831; H01L 21/76841; H01L 21/76849; H01L 21/7685–76852; H01L 23/5329–53295; H01L 23/5226

USPC ........................................................ 257/401
See application file for complete search history.

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 2014/0264908 A1* | 9/2014 | Lee ................... | H01L 21/76867 438/643 |
| 2016/0043035 A1* | 2/2016 | Lin ................... | H01L 21/76802 438/653 |

(Continued)

*Primary Examiner* — Caleen O Sullivan
(74) *Attorney, Agent, or Firm* — NZ CARR LAW OFFICE (57) ABSTRACT

An interconnection structure, along with methods of forming such, are described. The interconnection structure includes a first portion of a conductive layer, a second portion of the conductive layer disposed adjacent the first portion of the conductive layer, and a dielectric foam disposed between the first and second portions of the conductive layer. The dielectric foam includes fluid gaps filled with carbon dioxide gas.

20 Claims, 12 Drawing Sheets

(56) References Cited

U.S. PATENT DOCUMENTS

2017/0033043 A1* 2/2017 Lin .................... H01L 23/5329
2018/0158693 A1* 6/2018 Yatsuda ............ H01L 21/76826
2021/0317580 A1* 10/2021 You ................... H01L 23/53295

* cited by examiner

INTERCONNECTION STRUCTURE AND METHODS OF FORMING THE SAME

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions created new limiting factors. With decreasing semiconductor device dimensions, improved semiconductor devices with reduced capacitance coupling is needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A-3I show exemplary sequential processes for manufacturing a semiconductor device structure 100, in accordance with some embodiments. It is understood that additional operations can be provided before, during, and after processes shown by FIGS. 1A-3I, and some of the operations described below can be replaced or eliminated, for additional embodiments of the process. The order of the operations/processes may be interchangeable.

Figure 1A:
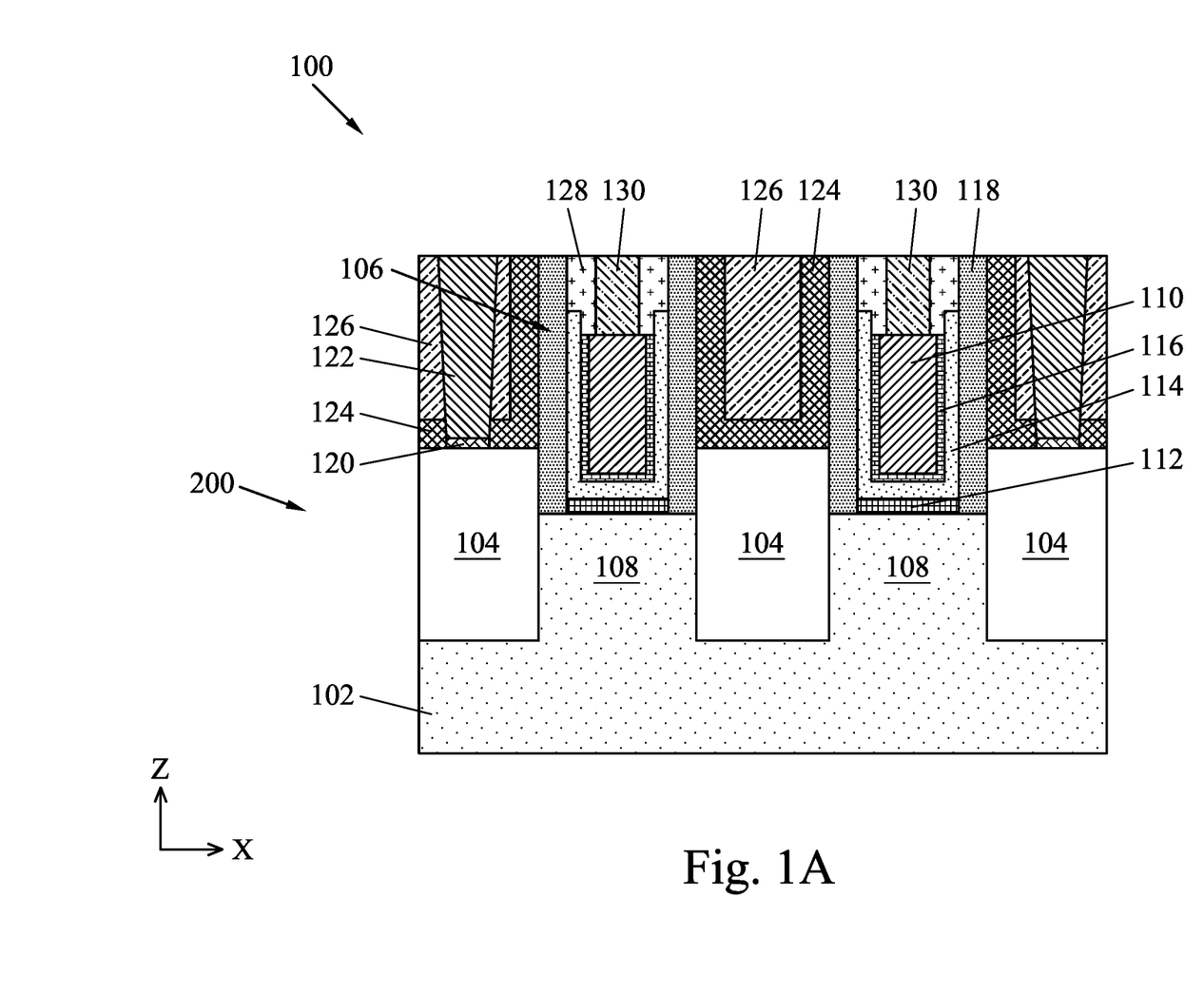
FIGS. 1A and 1B are cross-sectional views of one of the various stages of manufacturing a semiconductor device structure, in accordance with some embodiments.
Figure 1B:
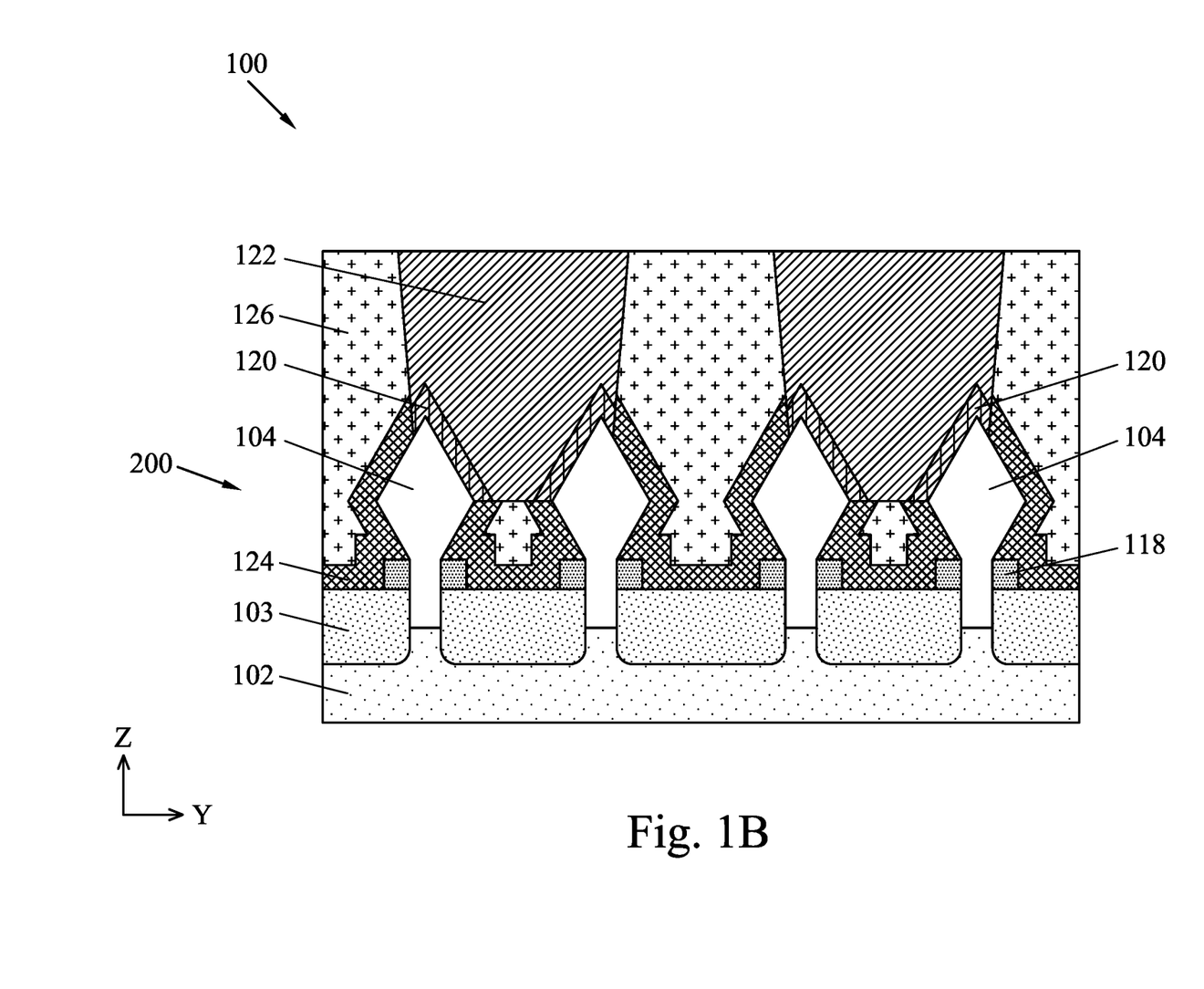

FIGS. 1A and 1B are cross-sectional side views of one of various stages of manufacturing the semiconductor device structure 100, in accordance with some embodiments. As shown in FIGS. 1A and 1B, the semiconductor device structure 100 includes a substrate 102 and one or more devices 200 formed on the substrate 102. The substrate 102 may be a semiconductor substrate. In some embodiments, the substrate 102 includes a single crystalline semiconductor layer on at least the surface of the substrate 102. The substrate 102 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). For example, the substrate 102 is made of Si. In some embodiments, the substrate 102 is a silicon-on-insulator (SOI) substrate, which includes an insulating layer (not shown) disposed between two silicon layers. In one aspect, the insulating layer is an oxygen-containing material, such as an oxide.

The substrate 102 may include one or more buffer layers (not shown) on the surface of the substrate 102. The buffer layers can serve to gradually change the lattice constant from that of the substrate to that of the source/drain regions. The buffer layers may be formed from epitaxially grown single crystalline semiconductor materials such as, but not limited to Si, Ge, germanium tin (GeSn), SiGe, GaAs, InSb, GaP, GaSb, InAlAs, InGaAs, GaSbP, GaAsSb, GaN, GaP, and InP. In one embodiment, the substrate 102 includes SiGe buffer layers epitaxially grown on the silicon substrate 102. The germanium concentration of the SiGe buffer layers may increase from 30 atomic percent germanium for the bottom-most buffer layer to 70 atomic percent germanium for the top-most buffer layer.

The substrate 102 may include various regions that have been suitably doped with impurities (e.g., p-type or n-type impurities). The dopants are, for example phosphorus for an n-type fin field effect transistor (FinFET) and boron for a p-type FinFET.

As described above, the devices 200 may be any suitable devices, such as transistors, diodes, imaging sensors, resistors, capacitors, inductors, memory cells, or a combination thereof. In some embodiments, the devices 200 are transistors, such as planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding the channels. An example of the device 200 formed on the substrate 102 is a FinFET, which is shown in FIGS. 1A and 1B. The device 200 includes source/drain (S/D) regions 104 and gate stacks 106. Each gate stack 106 may be disposed between S/D regions 104 serving as source regions and S/D regions 104 serving as drain regions. For example, each gate stack 106 may extend along the Y-axis between a plurality of S/D regions 104 serving as source regions and a plurality of S/D regions 104 serving as drain regions. As shown in FIG. 1A, two gate stacks 106 are formed on the substrate 102. In some embodiments, more than two gate stacks 106 are formed on the substrate 102. Channel regions 108 are formed between S/D regions 104 serving as source regions and S/D regions 104 serving as drain regions.

The S/D regions 104 may include a semiconductor material, such as Si or Ge, a III-V compound semiconductor, a II-VI compound semiconductor, or other suitable semiconductor material. Exemplary S/D region 104 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D regions 104 may include p-type dopants, such as boron; n-type dopants, such as phosphorus or arsenic; and/or other suitable dopants including combinations thereof. The S/D regions 104 may be formed by an epitaxial growth method using CVD, atomic layer deposition (ALD) or molecular beam epitaxy (MBE). The channel regions 108 may include one or more semiconductor materials, such as Si, Ge, GeSn, SiGe, GaAs, InSb, GaP, GaSb, InAlAs, InGaAs, GaSbP, GaAsSb, GaN, GaP, or InP. In some embodiments, the channel regions 108 include the same semiconductor material as the substrate 102. In some embodiments, the devices 200 are FinFETs, and the channel regions 108 are a plurality of fins disposed below the gate stacks 106. In some embodiments, the devices 200 are nanostructure transistors (e.g. gate-all-around transistor, nanowire transistor, nanosheet transistor, etc.), and the channel regions 108 are surrounded by the gate stacks 106.

Each gate stack 106 includes a gate electrode layer 110 disposed over the channel region 108 (or surrounding the channel region 108 for nanostructure transistors). The gate electrode layer 110 may be a metal-containing material such as tungsten, cobalt, aluminum, ruthenium, copper, multilayers thereof, or the like, and can be deposited by ALD, plasma enhanced chemical vapor deposition (PECVD), MBD, physical vapor deposition (PVD), or any suitable deposition technique. Each gate stack 106 may include an interfacial dielectric layer 112, a gate dielectric layer 114 disposed on the interfacial dielectric layer 112, and one or more conformal layers 116 disposed on the gate dielectric layer 114. The gate electrode layer 110 may be disposed on the one or more conformal layers 116. The interfacial dielectric layer 112 may include a dielectric material, such as an oxygen-containing material or a nitrogen-containing material, or multilayers thereof, and may be formed by any suitable deposition method, such as CVD, PECVD, or ALD. The gate dielectric layer 114 may include a dielectric material such as an oxygen-containing material or a nitrogen-containing material, a high-k dielectric material having a k value greater than that of silicon dioxide, or multilayers thereof. The gate dielectric layer 114 may be formed by any suitable method, such as CVD, PECVD, or ALD. The one or more conformal layers 116 may include one or more barrier layers and/or capping layers, such as a nitrogen-containing material, for example tantalum nitride (TaN), titanium nitride (TiN), or the like. The one or more conformal layers 116 may further include one or more work-function layers, such as aluminum titanium carbide, aluminum titanium oxide, aluminum titanium nitride, or the like. The term "conformal" may be used herein for ease of description upon a layer having substantial same thickness over various regions. The one or more conformal layers 116 may be deposited by ALD, PECVD, MBD, or any suitable deposition technique.

Gate spacers 118 are formed along sidewalls of the gate stacks 106 (e.g., sidewalls of the gate dielectric layers 114). The gate spacers 118 may include silicon oxycarbide, silicon nitride, silicon oxynitride, silicon carbon nitride, the like, multi-layers thereof, or a combination thereof, and may be deposited by CVD, ALD, or other suitable deposition technique.

Portions of the gate stacks 106 and the gate spacers 118 may be formed on isolation regions 103. The isolation regions 103 are formed on the substrate 102. The isolation regions 103 may include an insulating material such as an oxygen-containing material, a nitrogen-containing material, or a combination thereof. The insulating material may be formed by a high-density plasma chemical vapor deposition (HDP-CVD), a flowable chemical vapor deposition (FCVD), or other suitable deposition process. In one aspect, the isolation regions 103 includes silicon oxide that is formed by a FCVD process.

A contact etch stop layer (CESL) 124 is formed on a portion of the S/D regions 104 and the isolation region 103, and an interlayer dielectric (ILD) layer 126 is formed on the CESL 124. The CESL 124 can provide a mechanism to stop an etch process when forming openings in the ILD layer 126. The CESL 124 may be conformally deposited on surfaces of the S/D regions 104 and the isolation regions 103. The CESL 124 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be deposited by CVD, PECVD, ALD, or any suitable deposition technique. The ILD layer 126 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than silicon dioxide), and may be deposited by spin-on, CVD, FCVD, PECVD, PVD, or any suitable deposition technique.

A silicide layer 120 is formed on at least a portion of each S/D region 104, as shown in FIGS. 1A and 1B. The silicide layer 120 may include a material having one or more of WSi, CoSi, NiSi, TiSi, MoSi and TaSi. In some embodiments, the silicide layer 120 includes a metal or metal alloy silicide, and the metal includes a noble metal, a refractory metal, a rare earth metal, alloys thereof, or combinations thereof. A conductive contact 122 is disposed on each silicide layer 120. The conductive contact 122 may include a material having one or more of Ru, Mo, Co, Ni, W, Ti, Ta, Cu, Al, TiN or TaN, and the conductive contact 122 may be formed by any suitable method, such as electro-chemical plating (ECP), or PVD. The silicide layer 120 and the conductive contact 122 may be formed by first forming an opening in the ILD layer 126 and the CESL 124 to expose at least a portion of the S/D region 104, then forming the silicide layer 120 on the exposed portion of the S/D region 104, and then forming the conductive contact 122 on the silicide layer 120.

A dielectric material 128 may be formed over the gate stack 106, and a conductive contact 130 is formed in the dielectric material 128, as shown in FIG. 1A. The dielectric material 128 may be a nitrogen-containing material, such as SiCN. The conductive contact 130 may include the same material as the conductive contact 122. The conductive contact 130 may be electrically connected to the gate electrode layer 110.

Figure 2:
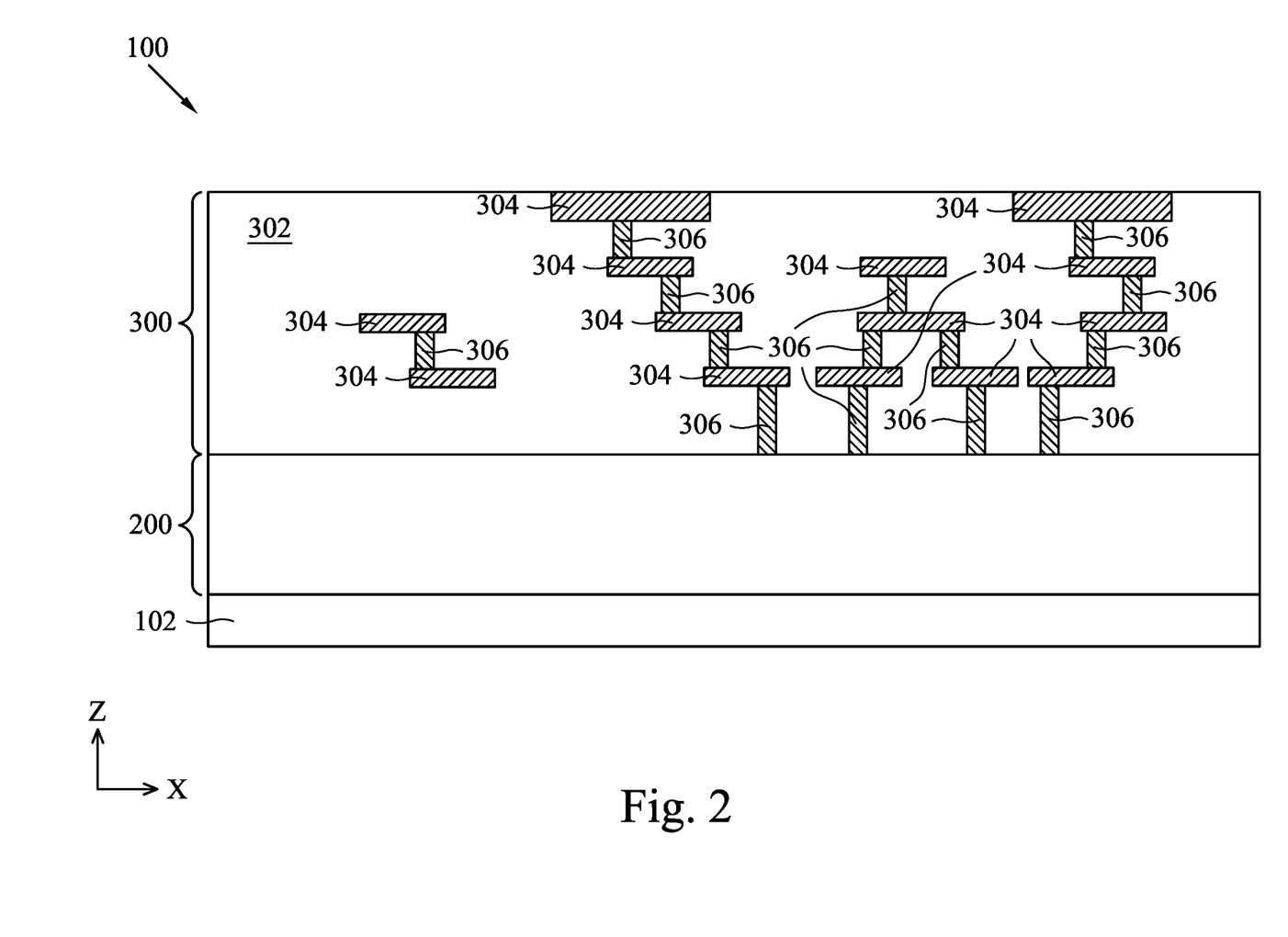
FIG. 2 is a cross-sectional side view of a stage of manufacturing an interconnection structure, in accordance with some embodiments.

The semiconductor device structure 100 may further include an interconnection structure 300 disposed over the devices 200 and the substrate 102, as shown in FIG. 2. The interconnection structure 300 includes various conductive features, such as a first plurality of conductive features 304 and second plurality of conductive features 306, and an intermetal dielectric (IMD) layer 302 to separate and isolate various conductive features 304, 306. In some embodiments, the first plurality of conductive features 304 are conductive lines and the second plurality of conductive features 306 are conductive vias. The interconnection structure 300 includes multiple levels of the conductive features 304, and the conductive features 304 are arranged in each level to provide electrical paths to various devices 200 disposed below. The conductive features 306 provide vertical electrical routing from the devices 200 to the conductive features 304 and between conductive features 304. For example, the bottommost conductive features 306 of the interconnection structure 300 may be electrically connected to the conductive contacts 122, 130 (FIG. 1A). The conductive features 304 and conductive features 306 may be made from one or more electrically conductive materials, such as one or more layers of graphene, metal, metal alloy, metal nitride, or silicide. For example, the conductive features 304 and the conductive features 306 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof.

The IMD layer 302 includes one or more dielectric materials to provide isolation functions to various conductive features 304, 306. The IMD layer 302 may include multiple dielectric layers embedding multiple levels of conductive features 304, 306. The IMD layer 302 is made from a dielectric material, such as $SiO_x$, $SiO_xC_yH_z$, or $SiO_xC_y$, where x, y and z are integers or non-integers. In some embodiments, the IMD layer 302 includes a low-k dielectric material having a k value less than that of silicon oxide. In some embodiments, the IMD layer 302 has a k value ranging from about 1.5 to about 3.9.

Figure 3A:
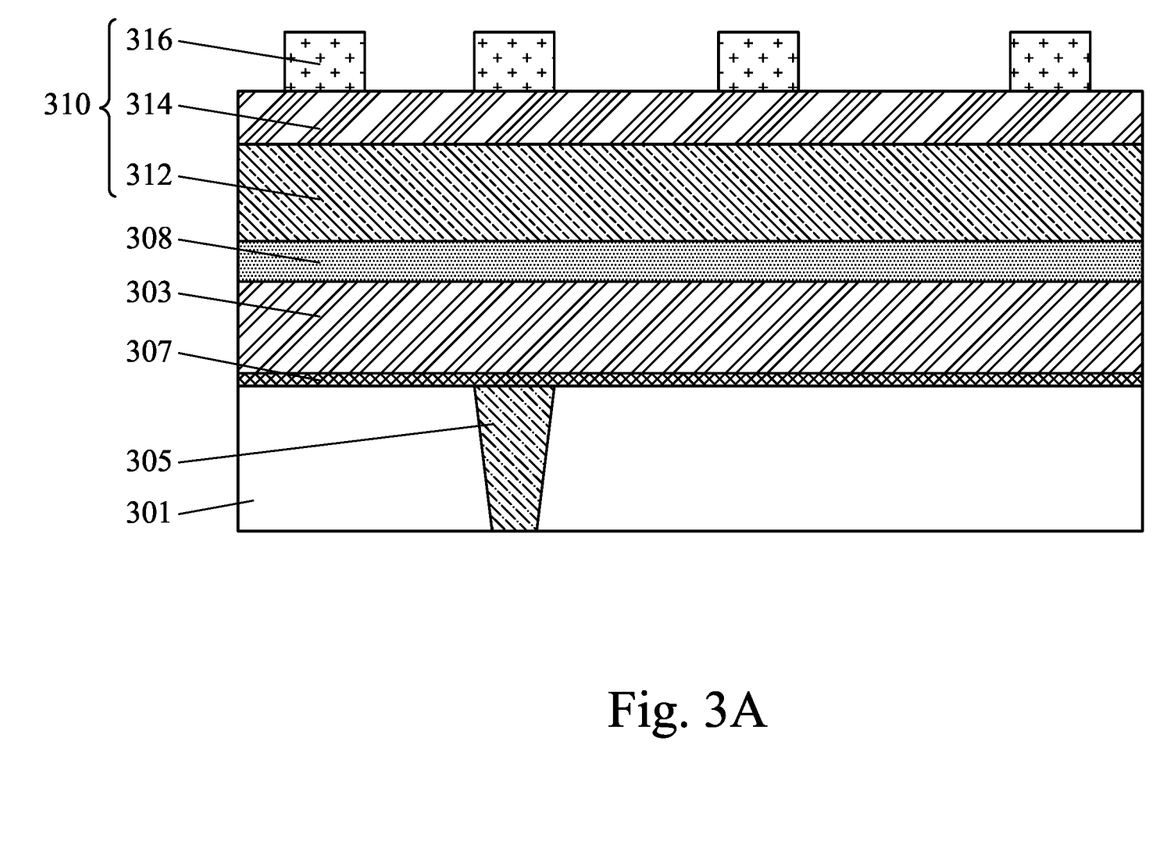
FIGS. 3A-3I are cross-sectional side views of various stages of manufacturing an interconnection structure, in accordance with some embodiments.

FIGS. 3A-3J are cross-sectional side views of various stages of manufacturing the interconnection structure 300, in accordance with some embodiments. As shown in FIG. 3A, the interconnection structure 300 includes a dielectric layer 301, which may be an ILD layer or an intermetal dielectric (IMD) layer. In some embodiments, the dielectric layer 301 may be disposed over the ILD layer 126 (FIG. 1). In some embodiments, the dielectric layer 301 may be disposed on the ILD layer 126 and the conductive contacts 122. The dielectric layer 301 may include an oxygen-containing material, such as silicon oxide or fluorine-doped silicate glass (FSG); a nitrogen-containing material, such as silicon nitride, silicon oxynitride (SiON), SiOCN, SiCN; a low-k dielectric material (e.g., a material having a k value lower than that of the silicon dioxide); or any suitable dielectric material. In some embodiments, the dielectric layer 301 includes silicon oxide. The dielectric layer 301 may be formed by chemical vapor deposition (CVD), atomic layer deposition (ALD), spin coating, or other suitable process.

One or more conductive features 305 (only one is shown) are disposed in the dielectric layer 301. The conductive feature 305 may include an electrically conductive material, such as Os, Ir, Co, Nb, Pt, Rh, Re, Cu, W, Cr, Ru, V, Pd, Mo, alloys thereof, or other suitable material. In some embodiments, the conductive feature 305 includes a metal. The conductive feature 305 may be formed by physical vapor deposition (PVD), CVD, ALD, or other suitable process. In some embodiments, the conductive feature 305 has a thickness ranging from about 200 Angstroms to about 500 Angstroms. In some embodiments, the conductive features 305 may be the conductive features 306 shown in FIG. 2. The conductive features 305 may be electrically connected to corresponding conductive contacts 122, 130 (FIG. 1A).

As shown in FIG. 3A, a glue layer 307, a conductive layer 313, a hard mask layer 308, and a mask structure 310 are formed over the dielectric layer 301. In some embodiment, the glue layer 307 is formed on the dielectric layer 301, the conductive layer 303 is formed on the glue layer 307, and the mask structure 310 is formed on the conductive layer 303. In some embodiments, the glue layer 307 is not present, and the conductive layer 303 is formed on the dielectric layer 301. The glue layer 307 may include one or more low electrical resistance materials, such as Ta, TaN, Ti, TiN, alloys thereof, or any suitable material. The glue layer may be formed by PVD, CVD, ALD, or other suitable process. In some embodiments, the glue layer is formed at a processing temperature ranging from about 10 degrees Celsius to about 400 degrees Celsius. The glue layer 307 may have a thickness ranging from about 5 Angstroms to about 20 Angstroms. The glue layer 307 may provide adhesion between the conductive layer 303 and the dielectric layer 301. The conductive layer 303 may include the same material as the conductive feature 305 and may be formed by the PVD or ALD. In some embodiments, the conductive layer 303 is formed at a processing temperature ranging from about 10 degrees Celsius to about 450 degrees Celsius. The conductive layer 303 may have the same thickness as the conductive feature 305.

The hard mask layer 308 may include a material that has high etch selectivity relative to the conductive layer 303. In some embodiments, the conductive layer 303 has an etch selectivity higher than 8 to the hard mask layer 308 and an etch selectivity higher than 5 to the glue layer 307. In some embodiments, the hard mask layer 308 may include $SiO_x$, SiC, SiOC, SiCN, SiN, Ti, TiN, Ta, TaN, Al, $AlO_x$, alloys thereof, the like, or a combination thereof, and may be formed by CVD, PVD, or ALD. The hard mask layer 308 may be formed at a processing temperature ranging from about 10 degrees Celsius to about 400 degrees Celsius. The hard mask layer 308 may have a thickness ranging from about 25 percent to about 75 percent of the thickness of the conductive layer 303. In some embodiments, the thickness of the hard mask layer 308 is about 50 percent of the conductive layer 303.

The mask structure 310 may be a tri-layer photoresist structure. For example, the mask structure 310 may include a bottom layer 312, a middle layer 314, and a photoresist layer 316. In some embodiments, the bottom layer 312 is a bottom anti-reflective coating (BARC) layer which is used to reduce reflection during the photolithography process. In some embodiments, the bottom layer 312 is made of a nitrogen-free material, such as silicon rich oxide, or silicon oxycarbide (SiOC). In some embodiments, the middle layer 314 is made of a silicon-based material, such as silicon nitride, silicon oxynitride or silicon oxide. The photoresist layer 316 may be a positive photoresist layer or a negative photoresist layer. In some embodiments, the photoresist layer 316 is made of poly (methyl methacrylate) (PMMA), poly (methyl glutarimide) (PMGI), phenol formaldehyde resin or other suitable material. In some embodiments, the ratio of the thickness of the bottom layer 312 to the thickness of the middle layer 314 is in a range from about 4 to about 8.

Figure 3B:
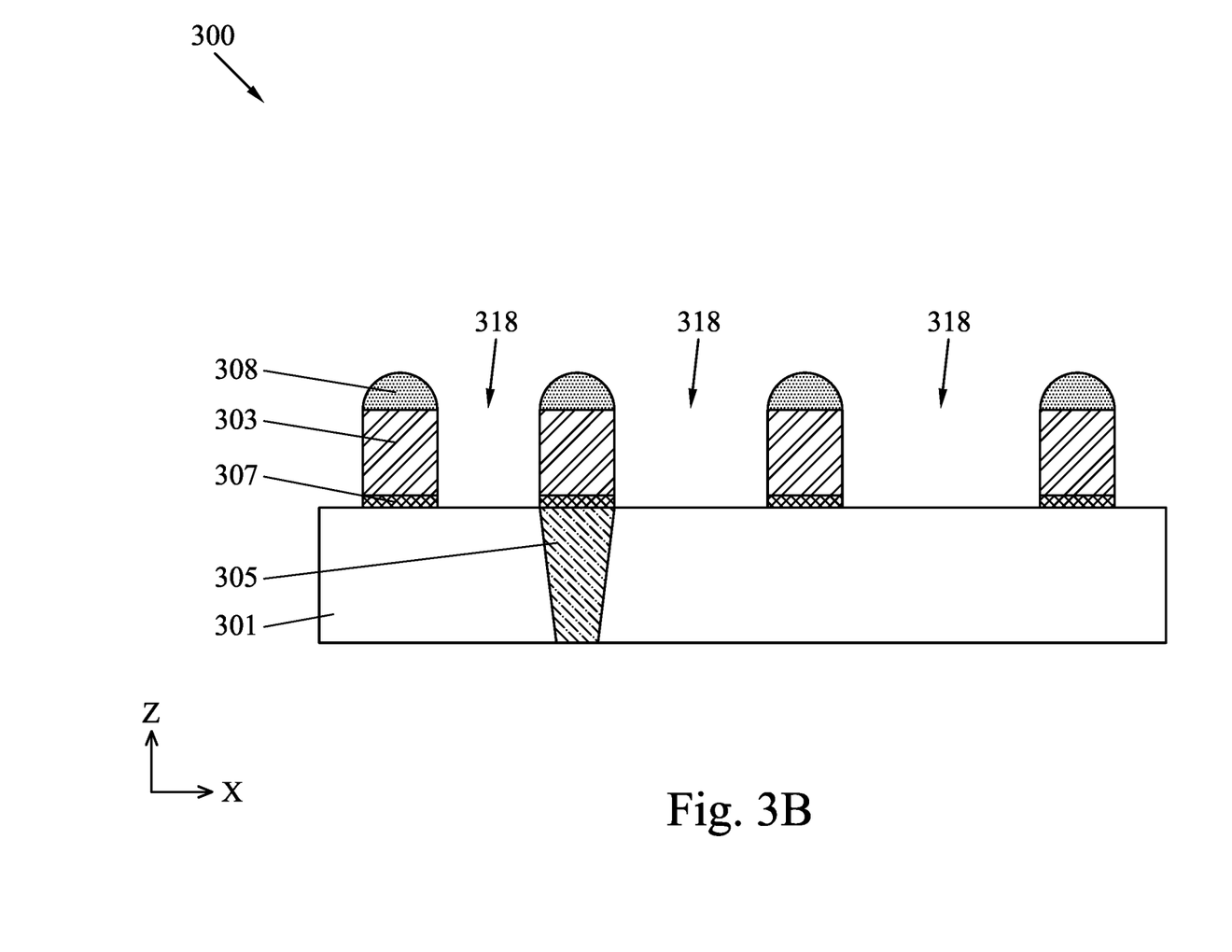

The photoresist layer 316 may be patterned as shown in FIG. 3A. Next, as shown in FIG. 3B, the pattern of the photoresist layer 316 is transferred to the hard mask layer 308. The pattern may be first transferred to the middle layer 314 and the bottom layer 312, and the remaining portions of the middle layer 314 and the bottom layer 312 may be removed during the transferring of the pattern to the hard mask layer 308. The transferring of the pattern from the photoresist layer 316 to the hard mask layer 308 may be performed by one or more etch processes. The one or more etch processes may be dry etch, wet etch, or a combination thereof. The pattern of the hard mask layer 308 is then transferred to the conductive layer 303 by an etch process. In some embodiments, the etch process is an inductively coupled plasma (ICP) reactive ion etching (ME). For example, the ICP ME may have a plasma power ranging from about 100 W to about 2000 W and a bias ranging from about 0 V to about 1200 V. One or more gases may be used in the ICP ME as an etchant and carrier gas. In some embodiments, one or more gases such as HBr, $SiCl_4$, $BCl_4$, $Cl_2$, $H_2$, $CH_4$, $N_2$, He, Ne, Kr, $CF_4$, $CHF_3$, $CH_3F$, $CH_2F_2$, $C_4F_8$, $C_4F_6$, $N_2$, $O_2$, Ar, or other suitable gas. As shown in FIG. 3B, the pattern may be also transferred to the glue layer 307 by the one or more etch processes.

As a result of the one or more etch processes, openings 318 may be formed, as shown in FIG. 3B. The openings 318 separates the conductive layer 303 and glue layer 307 into two or more portions. In some embodiments, each portion of the conductive layer 303 may be a conductive feature, such as a conductive line. For example, the conductive layer 303 includes one or more conductive features, such as a plurality of conductive features. In some embodiments, the plurality of conductive features of the conductive layer 303 is the conductive features 304 shown in FIG. 2. Each opening 318 exposes a portion of the dielectric layer 301.

Figure 3C:
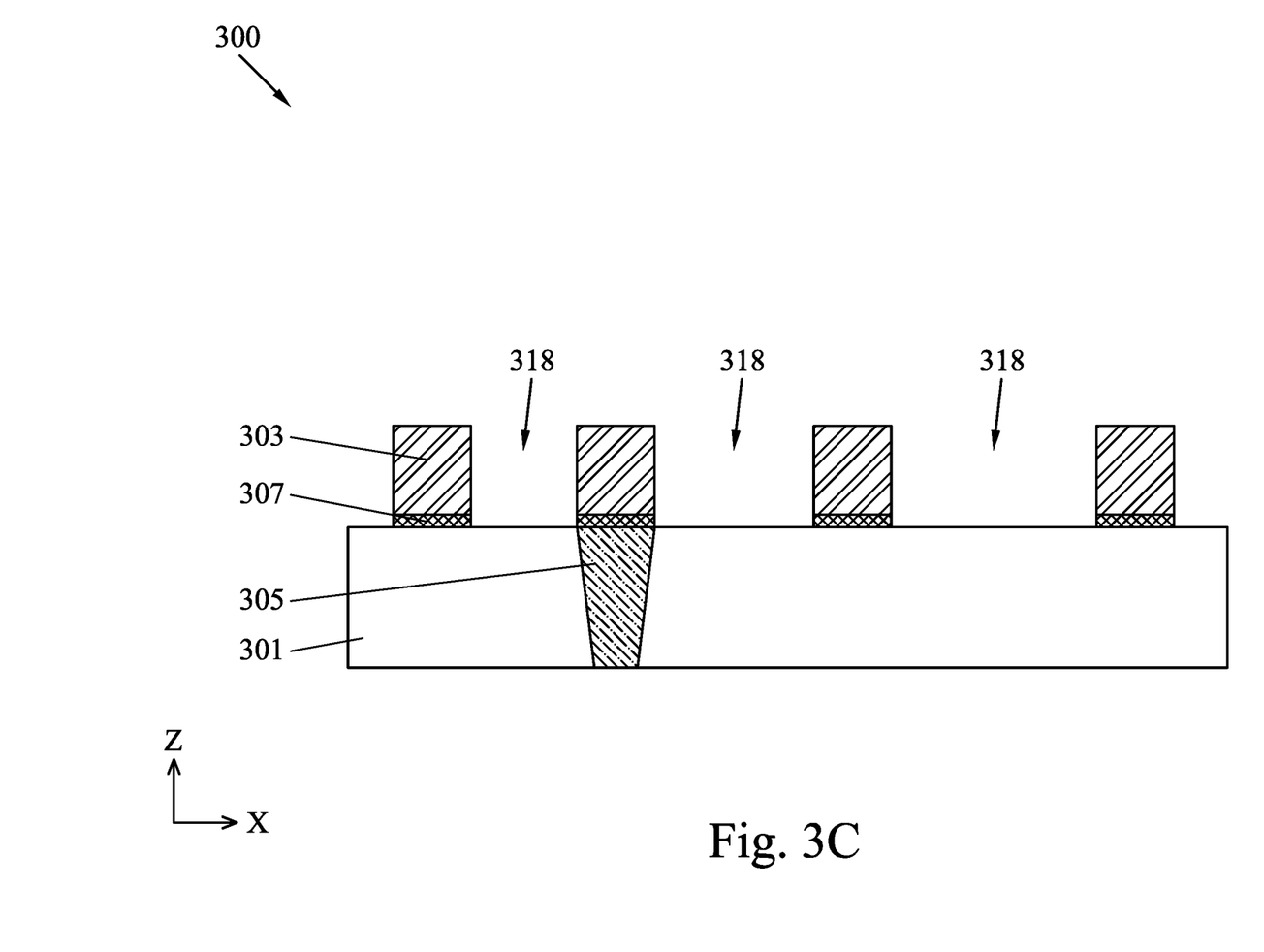
Figure 3D:
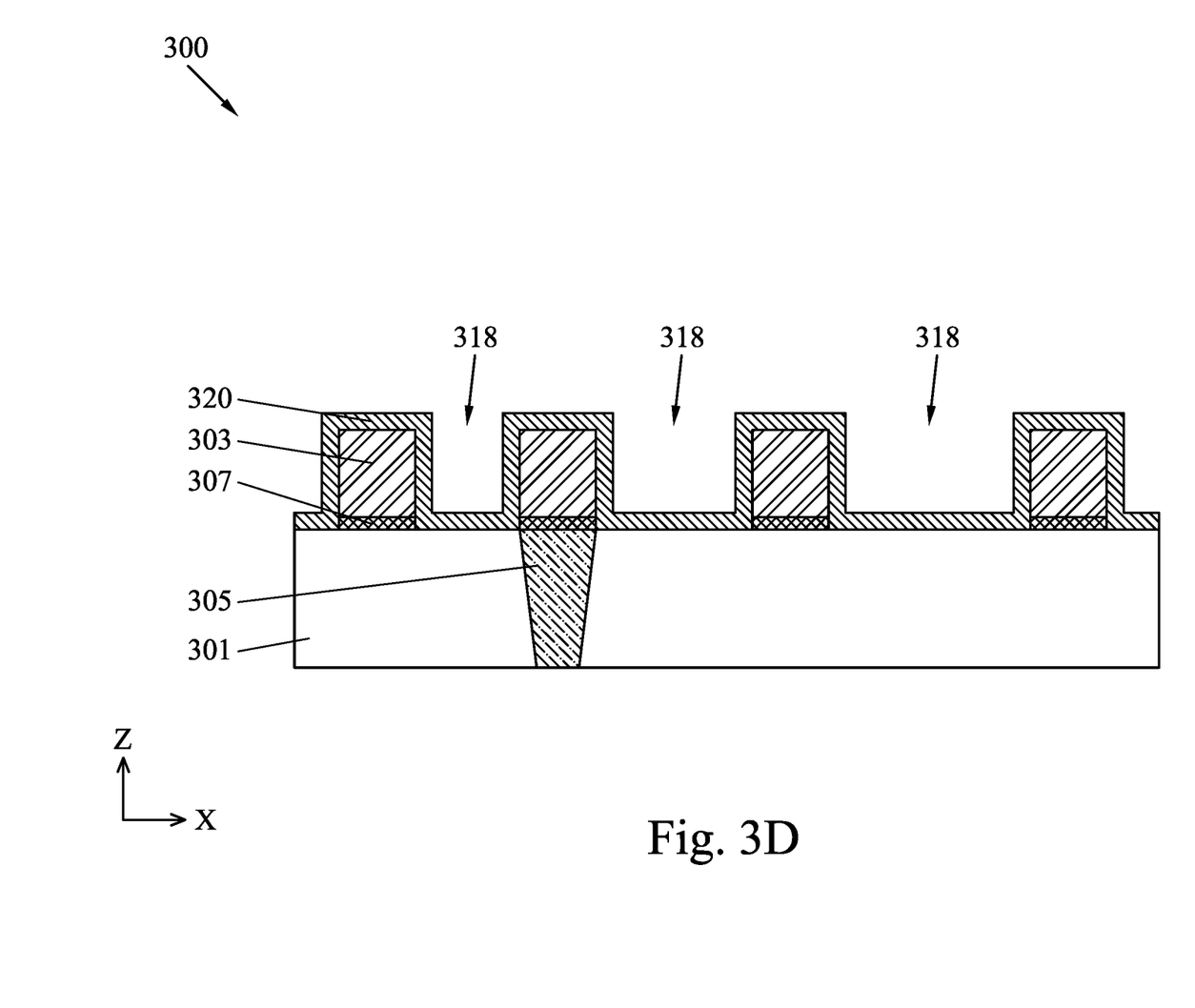

As shown in FIG. 3C, the hard mask layer 308 is removed. The hard mask layer 308 may be removed by any suitable process, such as a dry etch, a wet etch, or a combination thereof. In some embodiments, the hard mask layer 308 is removed by a selective wet etch process that removes the hard mask layer 308 but not the conductive layer 303 and the dielectric layer 301. As shown in FIG. 3D, a barrier layer 320 is formed on the dielectric layer 301 and the portions of the conductive layer 303. The barrier layer 320 may include a nitride, such as silicon nitride, SiOC, or other suitable material. The barrier layer 320 may block the metal from diffusing into subsequently formed dielectric material in the openings 318. The barrier layer 320 may be formed by a conformal process, such as ALD.

Figure 3E:
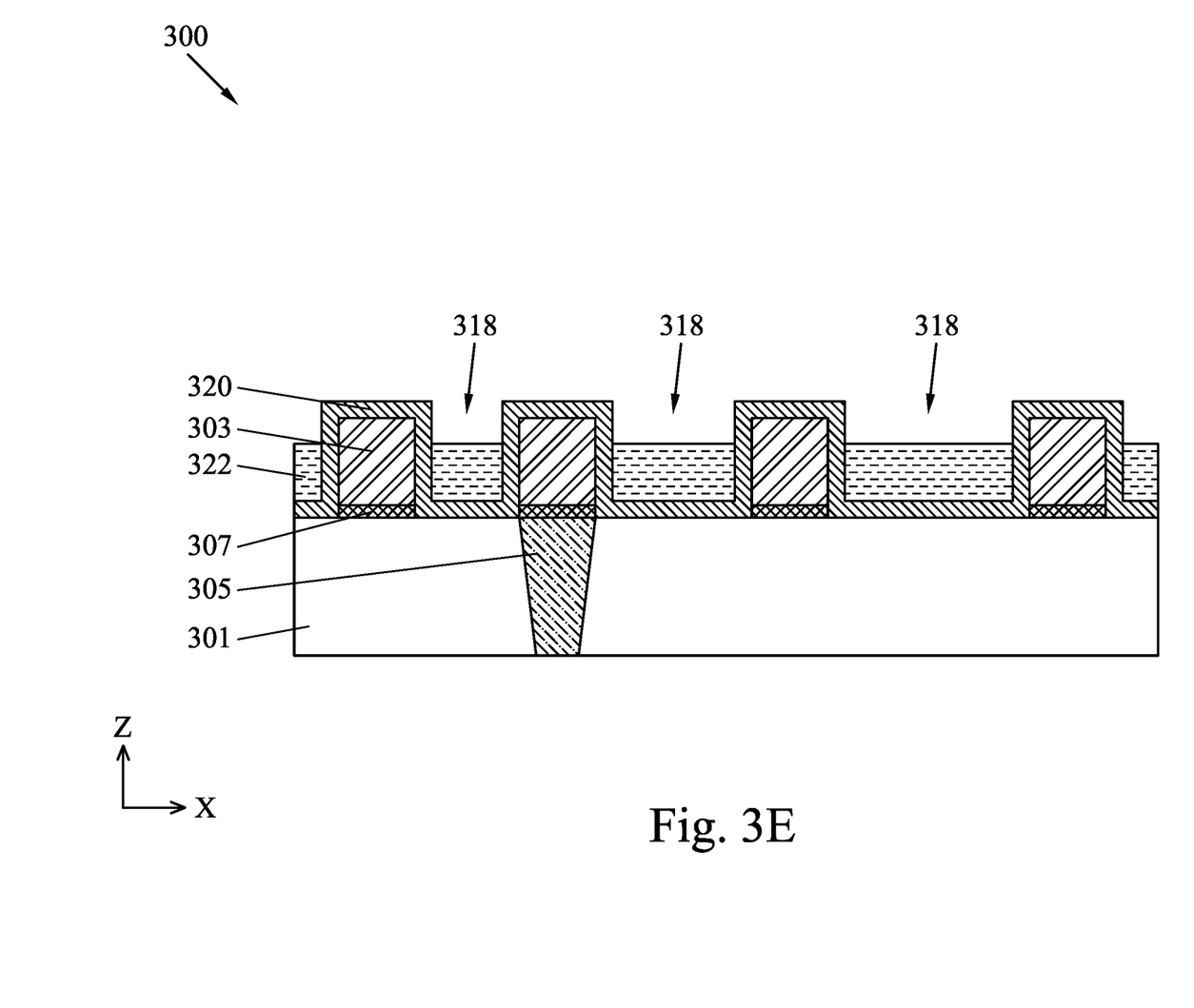

As shown in FIG. 3E, a dielectric material 322 is formed in the openings 318 to partially fill the openings 318. The dielectric material 322 may be a monomer having Si, O, C. For example, the dielectric material 322 includes a monomer having the following structure I:

where n is from 30 to 50. In some embodiments, the monomer of the dielectric material 322 includes isocyanate group having the following structure II:

where R may be any group including Si, O, C, H. In some embodiments, the group R includes the material having the structure I. In some embodiments, the monomer of the dielectric material 322 includes epoxide, amine, carbonic acid, anhydrate or hydroxyl terminated functional groups. In some embodiments, the monomer of the dielectric material 322 has a molecular weight (weight average) ranging from about 2000 to about 200000. The dielectric material 322 may be a low-k material has a k value less than that of silicon dioxide.

In some embodiments, the dielectric material 322 is formed by CVD at a processing temperature ranging from about 30 degrees Celsius to about 200 degrees Celsius. The CVD process may be a flowable CVD (FCVD) process. The thickness of the dielectric material 322 may range from about 120 Angstroms to about 240 Angstroms. In some embodiments, the thickness of the dielectric material 322 is less than the thickness of the conductive layer 303, such as about 25 percent to about 90 percent of the thickness of the conductive layer 303.

Figure 3F:
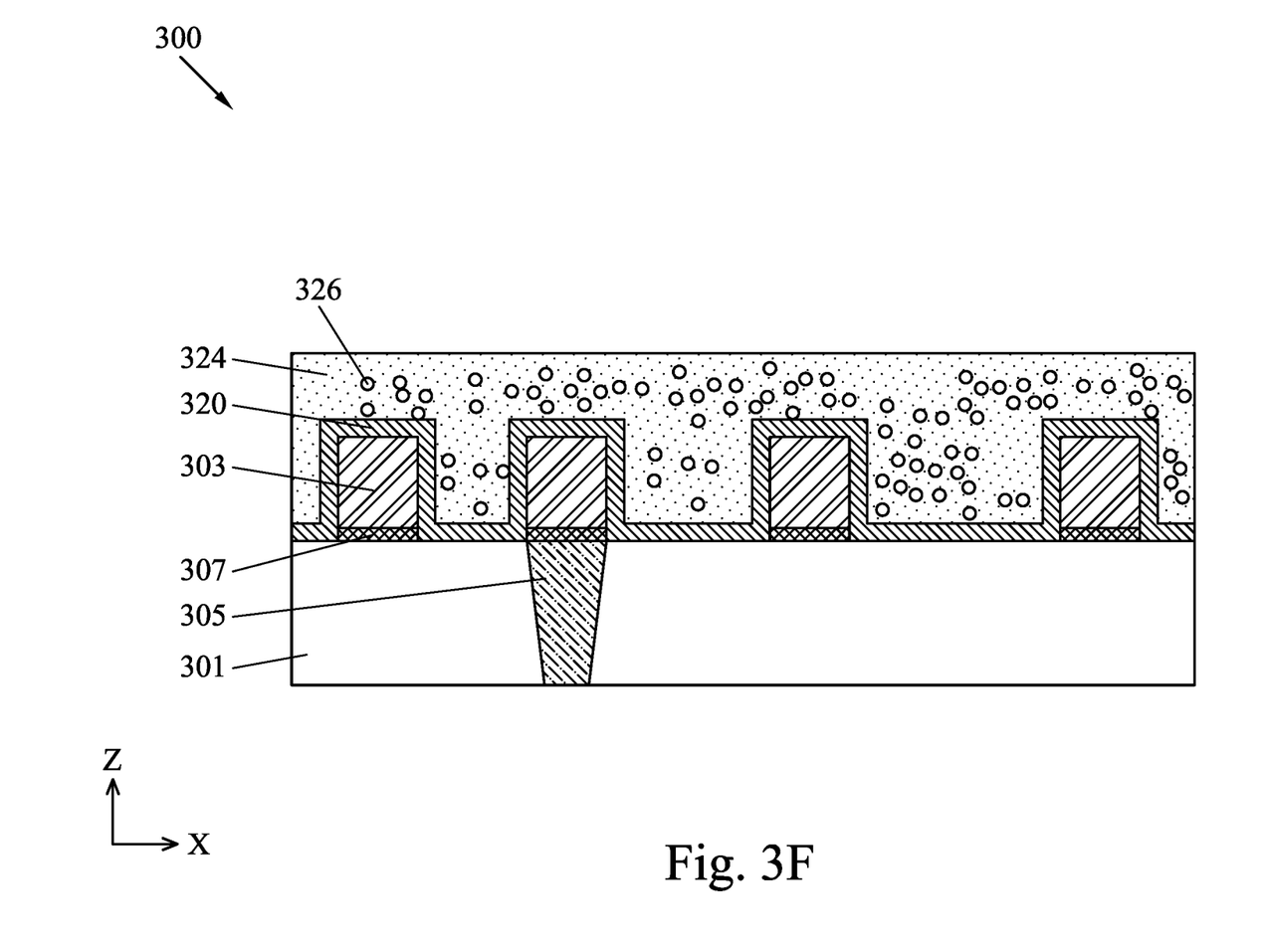

As shown in FIG. 3F, a foaming process is performed on the dielectric material 322 to form a foam material 324. The foam material 324 may be formed by the following reaction:

For example, high pressure, such as from about 2 ATM to about 5 ATM, water vapor ($H_2O$) may be introduced into the dielectric material 322 to react with the monomer having the isocyanate group. As a result, a primary amine and carbon dioxide gas is formed. The carbon dioxide gas may form fluid gaps 326 in the foam material 324. In other words, the fluid gaps 326 are filled with carbon dioxide gas. In some embodiments, the foam material 324 includes a compound having an amine group, and fluid gaps 326 are formed in the foam material 324. The foam material 324 may include a compound that is a primary amine, secondary amine, or tertiary amine. The foam material 324 may have a thickness that is about 1.5 to about 3 times the thickness of the conductive layer 303.

In some other embodiments, air gaps may be formed in a dielectric material having small critical dimension (CD) due to poor conformity to gap fill small CD. Furthermore, it is difficult to control the size and height of the air gaps, and the shape of the air gaps are not uniform due to various patterning density and dielectric topography. The fluid gaps 326 formed by the above-mentioned process has uniform nano-sized gaps. In some embodiments, the fluid gap 326 is spherical and has a diameter ranging from about 3 Angstroms to about 100 Angstroms. The size of the fluid gap 326 may be controlled by the type and/or amount of compound used to form the carbon dioxide gas, the chamber pressure, and the processing temperature. Furthermore, the location of the fluid gaps 326 in the foam material 324 may be controlled by tuning the above-mentioned process conditions. The fluid gaps 326 may be formed in dielectric material having a CD of any size and in dielectric material of any pattern density. In some embodiments, the foaming process is performed at a chamber pressure ranging from about 2 ATM to about 5 ATM and a processing temperature ranging from about 70 degrees Celsius to about 150 degrees Celsius.

Figure 3G:
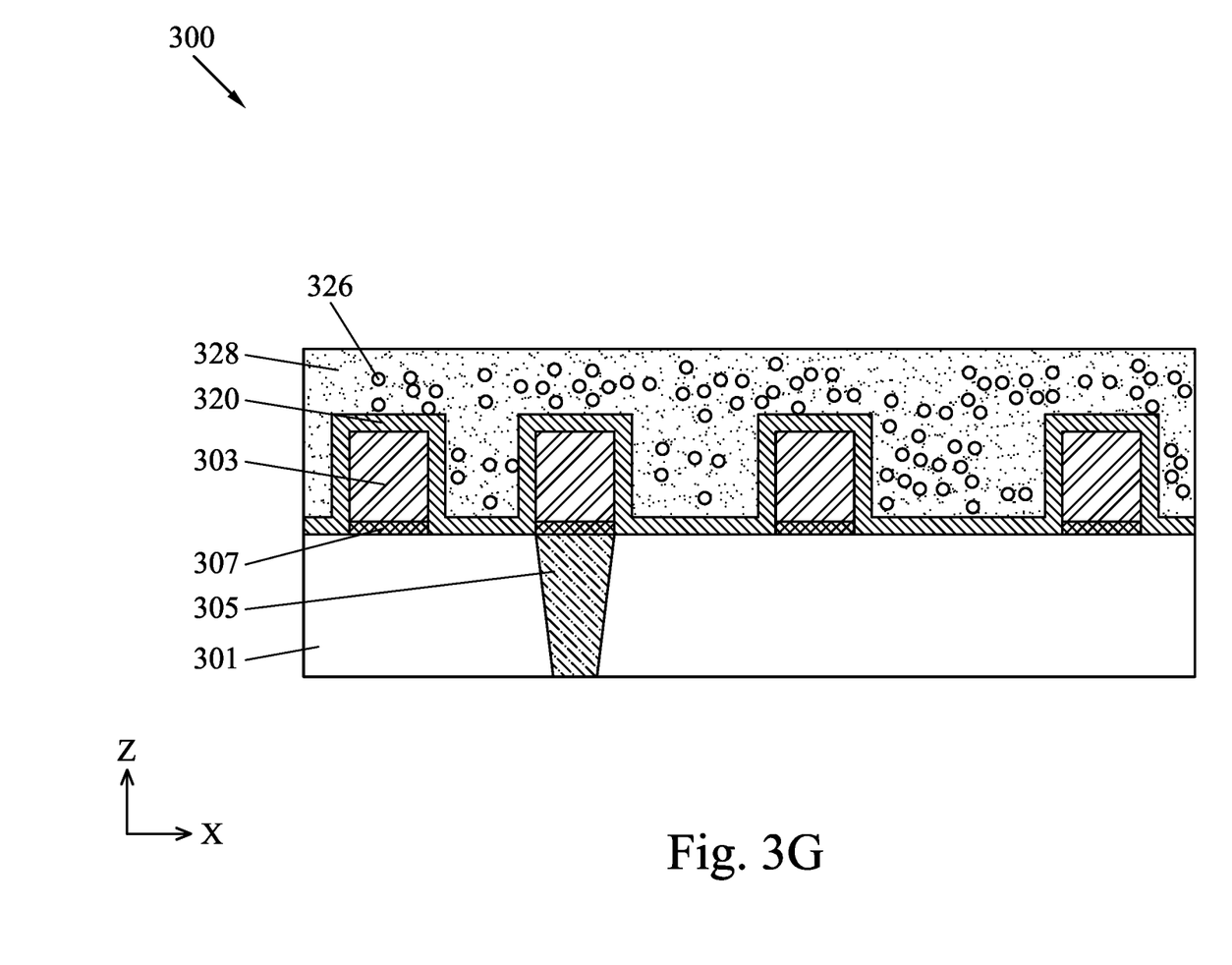

As shown in FIG. 3G, a curing process is performed to the foam material 324 to form the dielectric foam 328. The curing temperature may be higher than the temperature of the foaming process. The curing process is performed to complete the chemical reaction started during the foaming process and to cross-link the monomers of the foam material 324. As a result of the curing process, the dielectric foam 328 may be harder than the foam material 324 as a result of the cross-linking. The cross-linked dielectric foam 328 can provide improved structural support of subsequently formed materials on the dielectric foam 328.

The curing process may be a thermal curing, UV curing, or other suitable curing process. In some embodiments, the curing process is a thermal curing, and the curing temperature ranges from about 100 degrees Celsius to about 200 degrees Celsius. In some embodiments, the curing process is an UV curing with a lamp power ranging from about 100 W to about 2000 W, UV wavelength ranging from about 375 nm to about 405 nm, and distance between the lamp and the substrate ranging from about 0.5 cm to about 5 cm. The curing time may depend on the curing temperature or UV energy. In some embodiments, the curing time ranges from about 3 min to about 5 min. As a result of the curing process, the dielectric foam 328 includes a dielectric material including Si, O, C, and carbon dioxide gas filled fluid gaps 326. The fluid gaps 326 in the dielectric foam 328 may reduce capacitance by reducing the k value of the dielectric foam 328. In some embodiments, the k value of the dielectric foam 328 is less than the k value of the dielectric material 322.

Figure 3H:
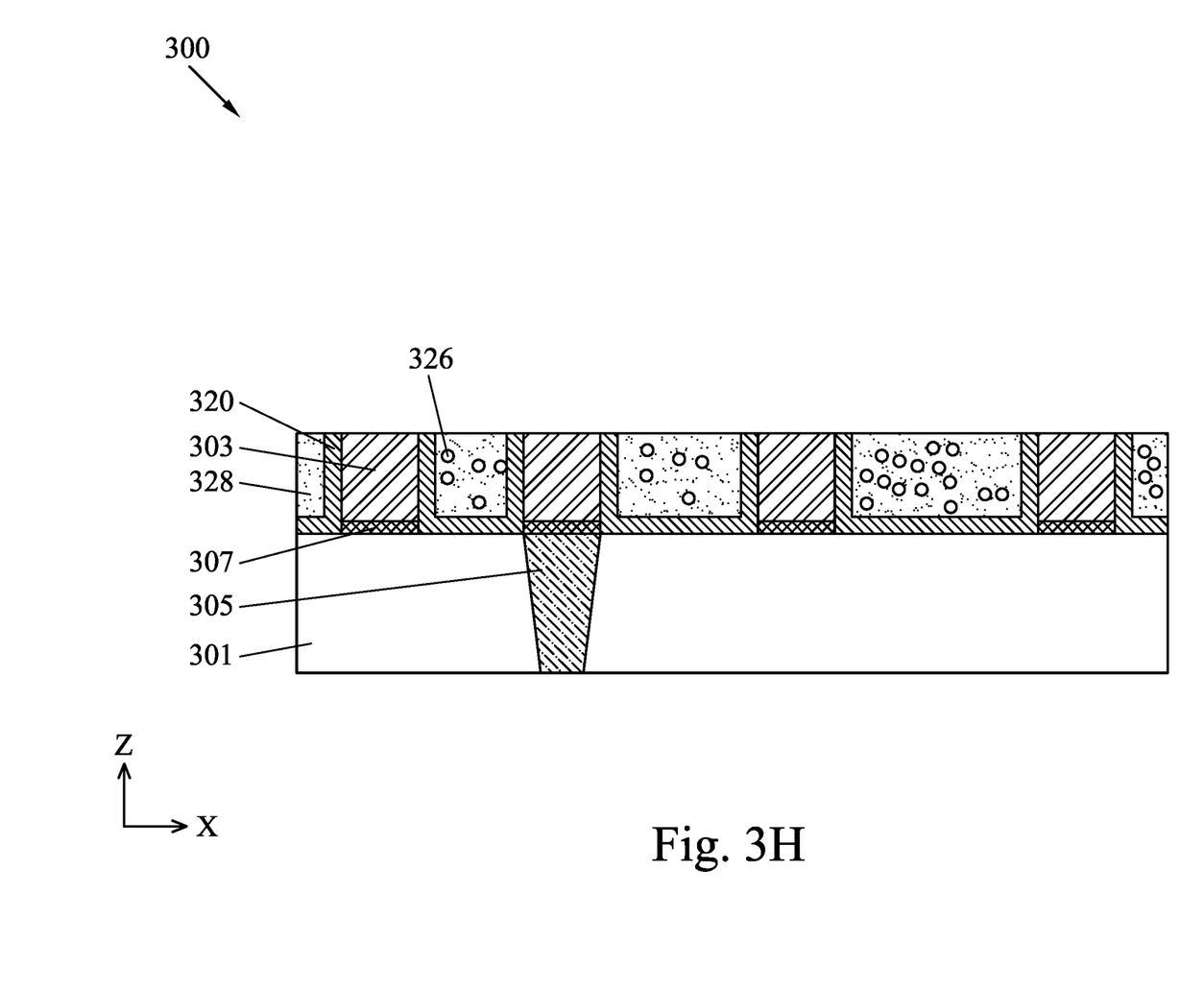
Figure 3I:
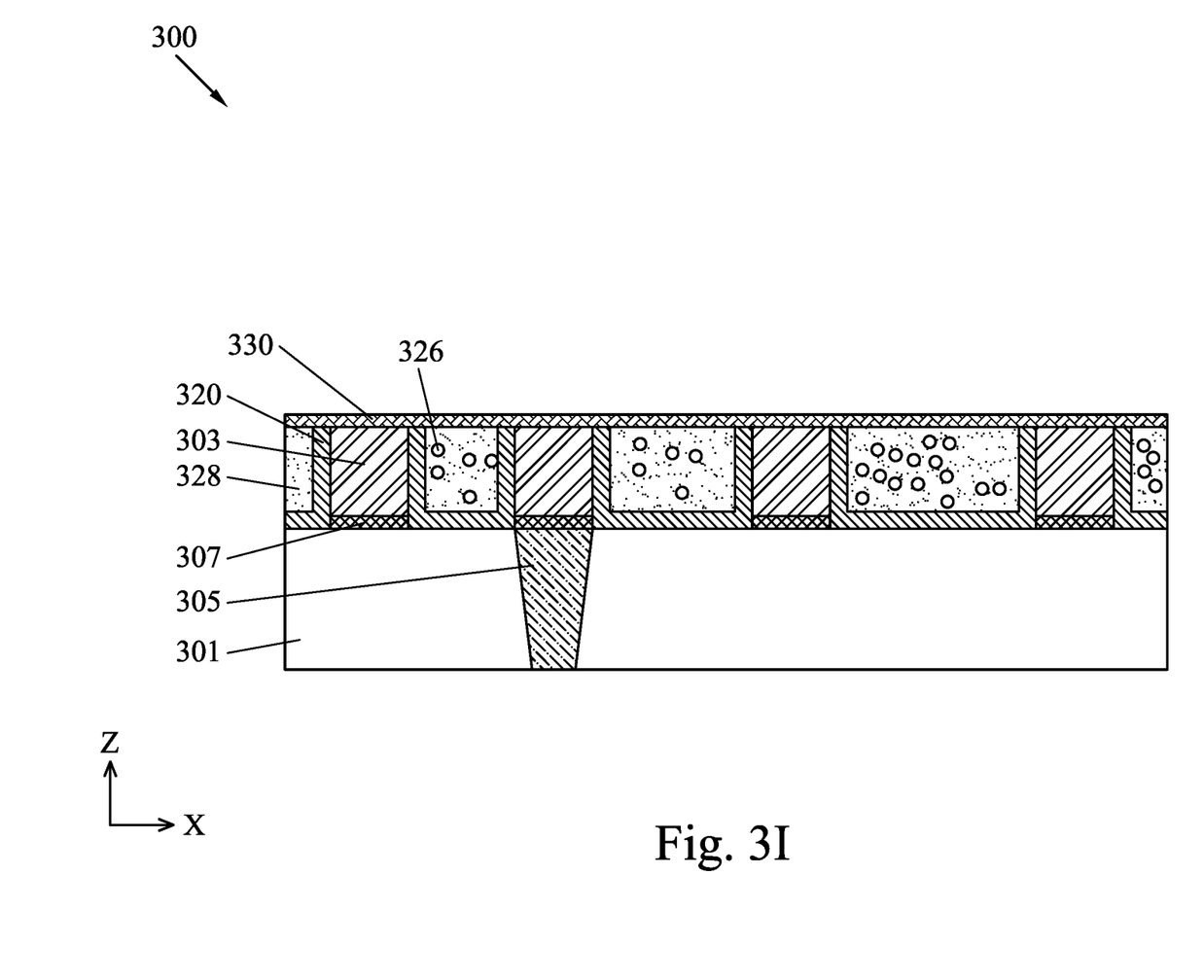

As shown in FIG. 3H, a planarization process is performed to remove a portion of the dielectric foam 328 disposed on the portions of the conductive layer 303. The planarization process may also remove the portions of the barrier layer 320 formed on the portions of the conductive layer 303. As a result, the portions of the conductive layer 303 are exposed. The planarization process may be any suitable process, such as chemical mechanical polishing (CMP) process. As shown in FIG. 3I, an etch stop layer 330 is formed on the portions of the conductive layer 303, the barrier layer 320, and the dielectric foam 328. The etch stop layer 330 may include an oxygen-containing material or a nitrogen-containing material, such as silicon nitride, silicon carbon nitride, silicon oxynitride, carbon nitride, silicon oxide, silicon carbon oxide, or the like, or a combination thereof. In some embodiments, the etch stop layer 330 includes a metal oxide. The etch stop layer 330 may be formed by any suitable process, such as CVD, PECVD, or ALD. In some embodiments, the etch stop layer 330 is a conformal layer formed by ALD. In some embodiments, a dielectric layer, such as the dielectric layer 301, may be formed on the etch stop layer 330. One or more conductive features, such as the conductive feature 305, may be formed in the dielectric layer. In some embodiments, a dielectric foam, such as the dielectric foam 328, is formed on the etch stop layer, and the conductive features are formed in the dielectric foam.

The portions of the conductive layer 303 and the dielectric foam 328 formed between adjacent portions of the conductive layer 303 may be utilized to reduce capacitance in an interconnection structure, such as the interconnection structure 300. For example, as shown in FIG. 2, the dielectric foam 328 and the portions of the conductive layer 303 may be a layer in the IMD layer 302. The portions of the conductive layer 303 may be the conductive features 304 disposed on one level, and the dielectric foam 328 is disposed between adjacent conductive features 304 on the level. In some embodiments, as shown in FIG. 2, the IMD layer 302 may be made of the dielectric foam 328, and the conductive features 304, 306 are embedded in the dielectric foam 328.

In some embodiments, the dielectric foam 328 is utilized in an interconnection structure, such as the interconnection structure 300. The dielectric foam 328 may be utilized in other structures to replace any dielectric material having air gaps formed therein. For example, the dielectric foam 328 may be utilized in the devices 200. In some embodiments, the dielectric foam 328 may be utilized to replace the gate spacers 118 in a transistor, as shown in FIG. 1A. In some embodiments, the dielectric foam 328 may be utilized to replace the dielectric material 128 to surround the conductive contact 130 shown in FIG. 1A.

Embodiments of the present disclosure provide an interconnection structure 300. In some embodiments, the interconnection structure 300 includes a first portion of a conductive layer 303, a second portion of the conductive layer 303 disposed adjacent the first portion of the conductive layer 303, and a dielectric foam 328 disposed between the first portion of the conductive layer 303 and the second portion of the conductive layer 303. The dielectric foam 328 may include carbon dioxide gas filled fluid gaps 326 formed therein. The dielectric foam 328 may include a compound having amine group. Some embodiments may achieve advantages. For example, the size of the fluid gap 326 may be controlled by the type and/or amount of compound used to form the carbon dioxide gas, the chamber pressure of the foaming process, and the processing temperature of the foaming process. Furthermore, the location of the fluid gaps 326 in the foam material 324 may be controlled by tuning the above-mentioned process conditions. The fluid gaps 326 may be formed in dielectric material having a CD of any size and in dielectric material of any pattern density. The dielectric foam 328 reduces the capacitance in an interconnection structure.

An embodiment is an interconnection structure. The structure includes a first portion of a conductive layer, a second portion of the conductive layer disposed adjacent the first portion of the conductive layer, and a dielectric foam disposed between the first and second portions of the conductive layer. The dielectric foam includes fluid gaps filled with carbon dioxide gas.

Another embodiment is a semiconductor device structure. The structure includes one or more devices, a first portion of a conductive layer disposed over the one or more devices, a second portion of the conductive layer disposed adjacent the first portion of the conductive layer, and a dielectric foam disposed between the first and second portions of the conductive layer. The dielectric foam includes a compound having an amine group and fluid gaps.

A further embodiment is a method. The method includes forming a conductive layer over a dielectric layer, forming a plurality of openings in the conductive layer to form a plurality of portions of the conductive layer, forming a dielectric material in the openings, and forming a foam material from the dielectric material. The foam material includes a plurality of fluid gaps filled with carbon dioxide gas. The method further includes curing the foam material to form a dielectric foam.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
    forming a conductive layer over a dielectric layer;

forming a plurality of openings in the conductive layer to form a plurality of portions of the conductive layer;
forming a dielectric material in the openings;
forming a foam material from the dielectric material, wherein the foam material comprises a plurality of fluid gaps filled with carbon dioxide gas; and
curing the foam material to form a dielectric foam.

2. The method of claim 1, further comprising forming a barrier layer on the plurality of portions of the conductive layer, wherein the dielectric material is formed on the barrier layer.

3. The method of claim 2, further comprising performing a planarization process to the dielectric foam.

4. The method of claim 3, further comprising forming an etch stop layer on the dielectric foam, the plurality of portions of the conductive layer, and the barrier layer.

5. The method of claim 1, wherein forming a foam material comprises introducing water vapor into the dielectric material, wherein the water vapor reacts with an isocyanate group to from an amine and carbon dioxide gas.

6. The method of claim 1, wherein the curing the foam material comprises a thermal curing including a curing temperature ranging from about 100 degrees Celsius to about 200 degrees Celsius, and wherein the dielectric foam has a lower k value than that of the dielectric material.

7. A method, comprising:
depositing a dielectric material over one or more transistors, wherein the dielectric material is deposited between portions of a conductive layer, and the dielectric material includes a monomer having an isocyanate group, wherein the dielectric material has a thickness substantially less than a thickness of the portions of the conductive layer;
performing a foaming process on the dielectric material to form a foam material; and
performing a curing process on the foam material to form a dielectric foam.

8. The method of claim 7, wherein the thickness of the dielectric material is about 25 percent to about 90 percent of the thickness of the portions of the conductive layer.

9. The method of claim 7, wherein the foam material has a thickness substantially greater than the thickness of the portions of the conductive layer.

10. The method of claim 9, wherein the thickness of the foam material is about 1.5 times to about 3 times the thickness of the portions of the conductive layer.

11. The method of claim 7, wherein the foaming process is performed at a chamber pressure ranging from about 2 ATM to about 5 ATM.

12. The method of claim 11, wherein the foaming process is performed at a processing temperature ranging from about 70 degrees Celsius to about 150 degrees Celsius.

13. The method of claim 7, wherein the isocyanate group of the monomer of the dielectric material has a structure of R—N=C=O.

14. The method of claim 13, wherein group R of the structure R—N=C=O has a structure of:

and n ranges from 30 to 50.

15. The method of claim 13, wherein the monomer of the dielectric material further comprises epoxide, amine, carbonic acid, anhydrate, or hydroxyl terminated functional groups.

16. A method, comprising:
forming one or more transistors over a substrate;
forming a conductive layer over the one or more transistors;
forming a plurality of openings in the conductive layer to form a plurality of portions of the conductive layer;
depositing a dielectric material in the openings;
introducing water vapor into the dielectric material to form a foam material, wherein the foam material comprises a plurality of fluid gaps filled with carbon dioxide gas; and
curing the foam material to form a dielectric foam.

17. The method of claim 16, wherein the dielectric material is deposited by a flowable chemical-vapor deposition process.

18. The method of claim 16, wherein the dielectric material has a thickness ranging from about 120 Angstroms to about 240 Angstroms.

19. The method of claim 16, further comprising performing a planarization process to remove a portion of the dielectric foam formed on the portions of the conductive layer.

20. The method of claim 16, wherein the dielectric material has a thickness substantially less than a thickness of the conductive layer, and the foam material has a thickness substantially greater than the thickness of the conductive layer.

* * * * *